United States Patent [19]
El-Ramly

[11] 3,969,619
[45] July 13, 1976

[54] ANALOG SERVO MEMORY
[75] Inventor: Mohamed A. R. El-Ramly, Windsor, Conn.
[73] Assignee: Combustion Engineering, Inc., Windsor, Conn.
[22] Filed: Feb. 13, 1975
[21] Appl. No.: 549,721

[52] U.S. Cl............................. 235/183; 307/235 G; 318/591; 328/71; 328/127
[51] Int. Cl.² ......................................... G06G 7/18
[58] Field of Search .............. 235/183; 328/71, 127, 328/151; 307/87, 235 A, 235 B, 235 F, 235 G; 318/591; 340/173 R, 173 CA

[56] References Cited
UNITED STATES PATENTS

| | | | |
|---|---|---|---|
| 3,655,992 | 4/1972 | Ohno et al. | 318/591 |
| 3,662,276 | 5/1972 | Hyer | 328/71 |
| 3,694,633 | 9/1972 | Le Jon | 318/591 |
| 3,740,652 | 6/1973 | Burgener | 307/235 G |
| 3,772,602 | 11/1973 | Kobayashi | 328/71 |
| 3,858,199 | 12/1974 | Neuner et al. | 307/235 G |

*Primary Examiner*—Jerry Smith

[57] ABSTRACT

A solid-state servo memory characterized by a maximum value selection circuit which provides, to an analog integrator, a signal commensurate with the magnitude of the one of a plurality of inputs having the instantaneously highest value. The memory is capable of operation in a manual or automatic mode and, in the automatic mode, the integrator is isolated from the memory output terminal but is continually reset to the output level of the selection circuit. In the manual mode the output of the integrator is coupled to the memory output terminal and may be driven in either direction.

7 Claims, 1 Drawing Figure

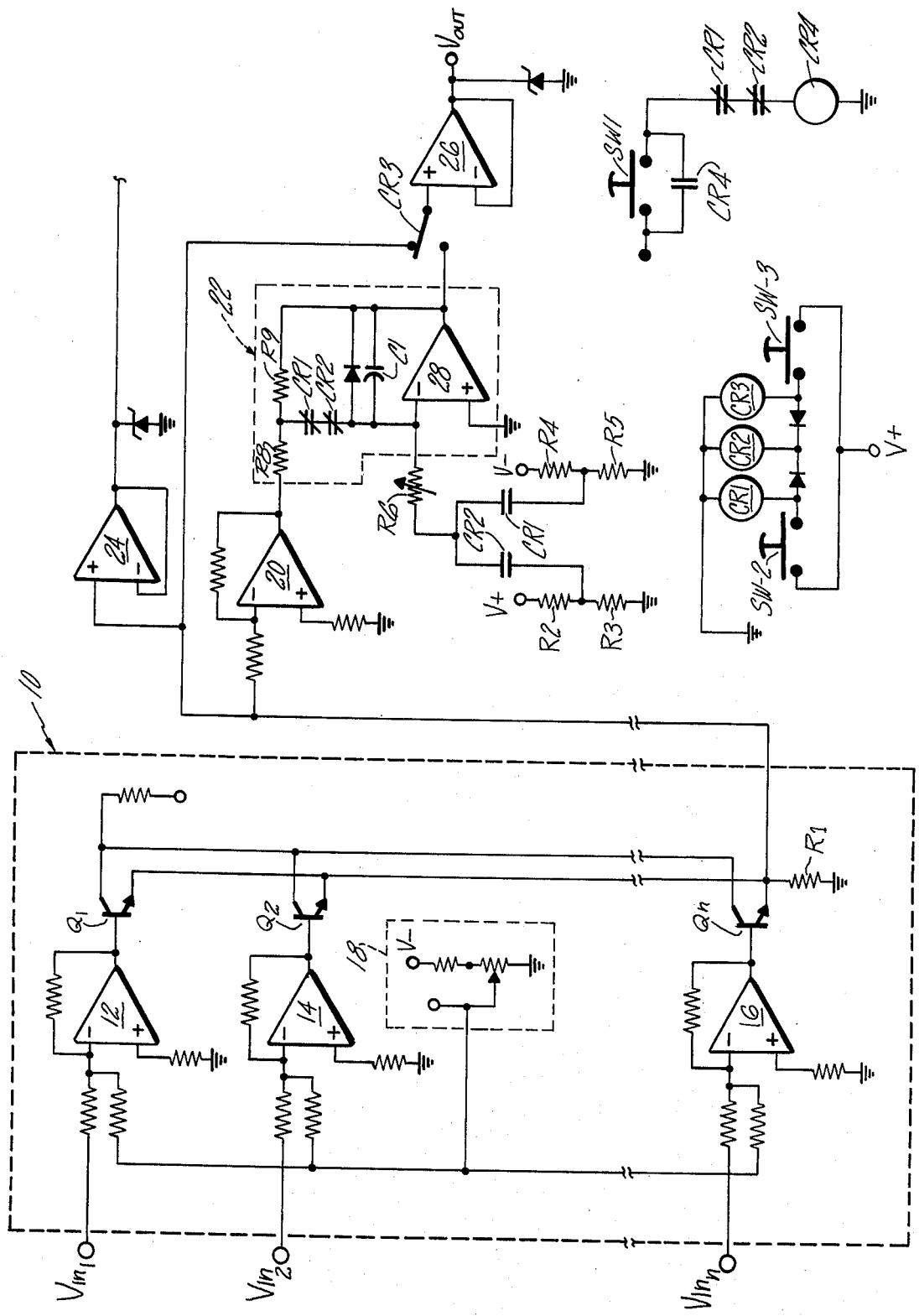

ANALOG SERVO MEMORY

BACKGROUND OF THE INVENTION:

1. Field of the Invention

The present invention relates to the storage of information and particularly to the generation and retention of a voltage commensurate with the position of a movable member. More specifically, this invention relates to a solid-state analog member with the capability of selecting the maximum value of a plurality of input signals respectively commensurate with the positions of movable members. Accordingly, the general objects of the present invention are to provide novel and improved methods and apparatus of such character.

2. Description of the Prior Art

There are numerous industrial control applications which require a "tracking" device capable of providing an indication of control system output when the system is driving a plurality of controller elements. Such "tracking devices" are used to provide a reference for the varying analog control signal so that, in cases of system transfer from automatic to a manual mode of operation, or vice versa, such transfer will be "bumpless". In many cases it is also desirable that the tracking device be capable of driving the control system output, in the manual mode of operation, in either of two opposite control directions. When used to drive the control system output, the tracking device must function as a reference for controlled elements which were not in operation at the time of the transfer from the automatic to the manual control mode.

Prior art memory devices for use with industrial controllers to perform the above briefly described tracking function have been both analog and digital devices. In the conventional analog device the tracking function is accomplished electromechanically through the use of a motor, potentiometer and servo amplifier. As is well known in the art, such motor driven potentiometers do not possess the requisite reliability due to wear on the potentiometer wiper arm and due to the possibility of motor failure.

Previously available digital "trackers" have the attribute of being solid-state devices. Such solid-state "trackers" employ an up-down counter that "remembers" digitally the last level of the controller output signal; the stored digital information being converted into an analog output signal through use of conventional digital to analog converters. Digital "tracking" devices possess a number of inherent disadvantages. Thus, by way of example, a loss of electrical power may cause a loss of memory; this possibility necessitating the use of an auxiliary battery to keep the up-down counter powered for a significant period of time. Also, digital tracking devices require a substantial number of components thus rendering the devices comparatively expensive.

It is also to be noted that, in prior art analog memory circuits which have received a plurality of input signals from controlled elements, it has been conventional practice to average the input signals and to "store" the average value. This technique affords the potential for substantial error should there be a failure of any one averaging circuit component.

SUMMARY OF THE INVENTION:

The present invention overcomes the above briefly discussed and other deficiencies and disadvantages of the prior art by providing a novel and improved solid-state analog servo memory having the capability of selecting the one of a plurality of input signals, commensurate with the position of a plurality of controlled elements, having the instantaneously maximum value. In accordance with the present invention a maximum value selection circuit receives the multiple input signals and provides an output potential, commensurate with the maximum of the input signals, to an analog integrator. The memory may be operated in either a manual or automatic control mode and, when in the manual control mode, the integrator output may be driven up or down thereby causing the memory output to similarly vary. Upon termination of the manual driving, the integrator output will be immediately reset to the output of the maximum value selection circuit. During the automatic mode of operation the output of the maximum value selection circuit will, in addition to being applied to the integrator, be coupled directly to the output of the memory and the integrator will be continuously reset.

BRIEF DESCRIPTION OF THE DRAWING:

The present invention may be better understood and its numerous objects and advantages will become apparent to those skilled in the art by reference to the accompanying drawing which is a schematic electrical circuit diagram of a preferred embodiment of the invention.

DESCRIPTION OF THE PREFERRED EMBODIMENT

With reference now to the drawing, input signals commensurate with the position of the drive shafts of a plurality of driven devices, the input signals typically being in the range of 0 to −10 volts and being labeled as $V_{in_1} - V_{in_n}$, are delivered to a maximum value selection circuit indicated generally at 10. These input signals are applied, via resistive summing circuits, to the negative input terminals of respective bias summing amplifiers 12, 14 and 16. In the input summing circuits the input signals are biased by a −0.6 volt signal provided by a bias voltage source 18. The output signals from amplifiers 12, 14 and 16 are respectively applied to the bases of transistors Q1, Q2 and $Q_n$. The transistor associated with the summing amplifier having the instantaneously highest output level will be forward biased into its conductive state thereby causing a voltage drop to be developed across resistor R1 equal to the input signal having the highest value; i.e., the −0.6 volt bias signal added at the input summing circuit will be dropped across the base-emitter junction of the transistor and the voltage drop across resistor R1 will thus equal the input to the amplifier itself without the bias. The remainder of transistors $Q_1 - Q_n$ will be switched off either because their base-emitter voltage is less than 0.6 volts or because the emitter voltage; i.e., the voltage across resistor R1; is greater than the base voltage.

The output of maximum value selection circuit 10; i.e., the voltage developed across resistor R1; is applied to the input of amplifier 20. Amplifier 20 functions as an inverter and thus provides an output signal in the range of 0–10 volts to an integrator indicated generally at 22. The output of the maximum value selection circuit is also applied to the input terminal of a further amplifier 24. The output of amplifier 24 may be employed to drive a position indicator meter. The output of the maximum value selection circuit 10 is further applied, via the normally closed contacts of a relay CR3, to a voltage follower amplifier 26; amplifier 26 providing impedance matching at the output terminal of the servo memory.

The analog servo memory of the present invention also includes, in addition to aforementioned relay CR3, an automatic mode selector switch SW-1. The contacts of automatic mode selector switch SW-1 are connected in series with normally closed contacts of a pair of relays CR1 and CR2 and the solenoid of a further relay CR4. A pair of normally open contacts of relay CR4 are connected in parallel with the contacts of switch SW-1. Accordingly, when switch SW-1 is momentarily closed, relay CR4 will be energized and will be latched in the energized condition until such time as either of relays CR1 or CR2 is energized.

The solenoids of CR1, CR2 and CR3 are connected in a manual mode selector circuit with a pair of normally open switches SW-2 and SW-3. Closing of the contacts of switch SW-2 will permit current to flow through the solenoids of relays CR1 and CR2. Closing of the contacts of switch SW-3 will permit current to flow through the solenoids of relays CR2 and CR3. The closing of either of switches SW-2 or SW-3 will thus result in the unlatching of relay CR4 and the switching of the system from the automatic to the manual control mode. Switch Sw-2 is the "up" or "open" control switch while switch SW-3 is the "down" or "closed" control switch.

When in the manual control mode, in order to increase or decrease the memory output signal, the appropriate one of switches SW-2 or SW-3 may be closed. This action will cause the integrator output voltage to increase or decrease, as appropriate, respectively through the application of a negative or positive voltage to the input of integrator amplifier 28. The voltages employed to manually drive the integrator output voltage up or down are developed, from respective negative and positive voltage sources $V_-$ and $V^+$, at voltage dividers R2,R3 and R4,R5. These driving voltages are applied to the input of integrator amplifier 28 via normally open contacts of relays CR1 and CR2; these contacts being closed by the energization of their associated solenoids upon the closing of either of switches SW-2 and SW-3. Accordingly, upon the closing of either of switches SW-2 or SW-3 the integrator will be allowed to charge up or down at an adjustable rate depending upon the setting of potentiometer R6; the change in the integrator output starting from the last positional voltage level as provided by the maximum value selector circuit 10.

The output signal from integrator 22, or more precisely the output from impedance matching amplifier 26, will drive the controlled elements thereby resulting in a variation in the input signals $V_{in_1} - V_{in_n}$ until such time as the closed one of switches SW-2 or SW-3 is released. When the manual control switch is released the integrator output will be immediately reset to the level selected by circuit 10. In actual practice, when all of the driven elements are functioning properly, the inputs to the maximum value selection circuit 10 should all be equal and should all have the same magnitude as the output of integrator 22.

Upon return to the automatic control mode, as commanded by the momentary closing of switch SW-1 and the latching of relay CR4, the output of the integrator will be disconnected from the input to the impedance matching amplifier 26. As noted above, since the solenoid of relay CR3 is deenergized at this time, the output of the maximum value selector circuit 10 will be applied directly to the input of amplifier 26 via the normally closed contacts of relay CR3. In the automatic control mode the output of integrator 22 will be continually reset to the voltage level selected by circuit 10 even though the integrator is not providing an output signal to impedance matching amplifier 26. Since the integrator output will track the memory circuit output, the analog memory of the present invention may be employed in a bumpless transfer circuit wherein transfer from automatic to manual mode and vice versa is accomplished smoothly with no proportional step. The integrator output signal is, of course, developed across the capacitor in the RC circuit consisting of resistors R8, R9 and capacitor C1.

It should be noted, in the manual mode of operation with the output being driven up or down by holding closed of one of switches SW-2 or SW-3, the output of inverter 20 will not affect the integrator output since the summing junction of amplifier 28 will be open due to the opening of the normally closed contacts of one of relays CR1 and CR2; these normally closed relay contacts being connected in series with the input to integrator amplifier 28. Upon release of either of switches SW-2 or SW-3 the integrator output will be reset to match the output of maximum value selection circuit 10; the resetting time being a function of the time constant of the RC circuit of the integrator.

As will now be obvious to those skilled in the art, the present invention comprises an inexpensive, accurate and reliable analog servo memory. Also, unlike prior art devices of similar character, the analog servo memory of the present invention does not resort to averaging the input signals. The selection of the maximum value of the multiple input signals enhances reliability and accuracy by eliminating the possibility of errors of substantial magnitude resulting from a failure of any one averaging circuit element.

While a preferred embodiment has been shown and described, various modifications and substitutions may be made thereto without departing from the spirit and scope of the invention. Accordingly, it is to be understood that the present invention has been described by way of illustration and not limitation.

What is claimed is:

1. An analog servo memory, said memory having an output terminal and receiving a plurality of input signals in the form of variable direct current potentials, said memory comprising:
    maximum value selector circuit means, said maximum value selector circuit means receiving said plurality of said input signals and providing an output signal commensurate with the magnitude of the input signal having the instantaneously highest magnitude;
    an analog integrator, said integrator having an input and an output;
    automatic-manual mode selector switch means;
    means coupling a first contact of said selector switch means to the memory output terminal;
    means connecting a second contact of said selector switch means to the output of said maximum value selector circuit means, said first and second contacts of said selector switch means being closed in the automatic mode position and being open in the manual mode position;

means connecting a third contact of said selector switch means to the output of said integrator, said first and third contacts of said selector switch means being open in the automatic mode position and being closed in the manual mode position;

means for selectively delivering the output signal provided by said maximum value selector circuit means to the input of said integrator, said selective delivering means isolating the integrator from the maximum value selector circuit means output signal when said selector switch means is in the manual mode position; and means for selectively varying the magnitude of the signal appearing at the output of said integrator independently of the value of input signals applied to said maximum value selector circuit means.

2. The apparatus of claim 1 wherein said means for selectively varying the magnitude of the integrator output signal comprises:

means for generating a positive bias signal;

means for generating a negative bias signal; and means for selectively applying one of said bias signals to the integrator input when said selector switch means is in the manual mode position.

3. The apparatus of claim 2 wherein said means connecting the first contact of said selector switch means to the memory output terminal comprises:

impedance matching means.

4. The apparatus of claim 1 wherein said means connecting the first contact of said selector switch means to the memory output terminal comprises:

impedance matching means.

5. The apparatus of claim 1 wherein said maximum value selector circuit means comprises:

a plurality of summing circuit means, each of said summing circuit means receiving one of said input signals; and a plurality of voltage responsive solid-state switch means, said switch means having a common output terminal connected to said means coupling the output signal provided by the maximum value selection circuit to said integrator, said switch means being respectively connected to individual of said summing circuit means.

6. The apparatus of claim 1 wherein said maximum value selector circuit means comprises:

a plurality of transistor switches, said transistor switches having their collector electrodes connected to a common voltage source, said transistor switches having a common emitter circuit connected to said means selectively coupling the output signal provided by said maximum value selector circuit means to said integrator; and means coupling input signals of said plurality respectively to base electrodes of respective of said transistor switches whereby the transistor switch with the highest base voltage will be rendered conductive and the remainder of said transistor switches will be disabled.

7. The apparatus of claim 6 wherein said means coupling the input signals to the base electrodes of said transistor switches each comprises:

a summing amplifier.

* * * * *